(12) United States Patent
Ware et al.

(10) Patent No.: US 10,241,940 B2
(45) Date of Patent: Mar. 26, 2019

(54) MEMORY MODULE WITH REDUCED READ/WRITE TURNAROUND OVERHEAD

(71) Applicant: Rambus Inc., Sunnyvale, CA (US)

(72) Inventors: Frederick A. Ware, Los Altos Hills, CA (US); Craig E. Hampel, Los Altos, CA (US)

(73) Assignee: Rambus Inc., Sunnyvale, CA (US)

( * ) Notice: Subject to any disclaimer, the term of this patent is extended or adjusted under 35 U.S.C. 154(b) by 84 days.

(21) Appl. No.: 15/314,316

(22) PCT Filed: May 26, 2015

(86) PCT No.: PCT/US2015/032486
§ 371 (c)(1),
(2) Date: Nov. 28, 2016

(87) PCT Pub. No.: WO2015/183834
PCT Pub. Date: Dec. 3, 2015

(65) Prior Publication Data
US 2017/0097904 A1    Apr. 6, 2017

Related U.S. Application Data

(60) Provisional application No. 62/003,383, filed on May 27, 2014.

(51) Int. Cl.
*G06F 13/16* (2006.01)
*G11C 7/10* (2006.01)
(Continued)

(52) U.S. Cl.
CPC ...... *G06F 13/1673* (2013.01); *G06F 13/4068* (2013.01); *G11C 5/04* (2013.01);
(Continued)

(58) Field of Classification Search
CPC ............. G06F 13/1673; G06F 13/4068; G11C 11/4082; G11C 11/4093
See application file for complete search history.

(56) References Cited

U.S. PATENT DOCUMENTS 5,497,351 A * 3/1996 Oowaki ............... G11C 7/10
365/230.03
5,778,419 A    7/1998 Hansen et al.
(Continued)

FOREIGN PATENT DOCUMENTS

WO  WO-2013-115783 A1  8/2013
WO  WO 2013115783 A1 *  8/2013 ............. G11C 29/52

OTHER PUBLICATIONS

PCT International Search Report and Written Opinion dated Sep. 3, 2015 in International Application No. PCT/US2015/032486. 8 pages.

*Primary Examiner* — Henry Tsai
*Assistant Examiner* — John B Roche
(74) *Attorney, Agent, or Firm* — Lance Kreisman; Peninsula Patent Group (57) ABSTRACT

A memory module includes a substrate, plural memory devices, and a buffer. The plural memory devices are organized into at least one rank, each memory device having plural banks. The buffer includes a primary interface for communicating with a memory controller and a secondary interface coupled to the plural memory devices. For each bank of each rank of memory devices, the buffer includes data buffer circuitry and address buffer circuitry. The data buffer circuitry includes first storage to store write data transferred during a bank cycle interval (tRR). The address buffer circuitry includes second storage to store address information corresponding to the data stored in the first storage.

19 Claims, 7 Drawing Sheets

(51) Int. Cl.
  *G11C 5/04*      (2006.01)
  *G06F 13/40*     (2006.01)
  *G11C 11/408*    (2006.01)
  *G11C 11/4093*   (2006.01)

(52) U.S. Cl.
  CPC .............. *G11C 7/10* (2013.01); *G11C 7/1042* (2013.01); *G11C 11/4082* (2013.01); *G11C 11/4093* (2013.01); *G11C 2207/229* (2013.01)

(56) References Cited

U.S. PATENT DOCUMENTS

| | | | |
|---|---|---|---|
| 6,640,292 B1 | 10/2003 | Barth et al. | |
| 7,047,375 B2 | 5/2006 | Davis et al. | |
| 7,246,250 B2* | 7/2007 | Jung | G06F 13/1689 |
| | | | 713/401 |
| 7,870,351 B2 | 1/2011 | Resnick | |
| 8,108,607 B2 | 1/2012 | Shaeffer et al. | |
| 8,219,745 B2* | 7/2012 | Bellows | G06F 13/1673 |
| | | | 711/105 |
| 8,281,101 B2 | 10/2012 | Bains et al. | |
| 8,289,335 B2 | 10/2012 | Hansen et al. | |
| 8,516,185 B2 | 8/2013 | Lee et al. | |
| 2004/0100851 A1 | 5/2004 | Covino et al. | |
| 2006/0171236 A1 | 8/2006 | Atwood et al. | |
| 2007/0079056 A1 | 4/2007 | Ruckerbauer et al. | |
| 2008/0162799 A1 | 7/2008 | Spry et al. | |
| 2012/0179880 A1* | 7/2012 | Ware | G06F 13/1663 |
| | | | 711/148 |
| 2012/0204079 A1 | 8/2012 | Takefman et al. | |
| 2012/0287729 A1 | 11/2012 | Hirobe | |
| 2013/0058145 A1 | 3/2013 | Yu et al. | |

\* cited by examiner

Figure 7

MEMORY MODULE WITH REDUCED READ/WRITE TURNAROUND OVERHEAD

CROSS REFERENCES TO RELATED APPLICATIONS

This application is a national stage application of international application number PCT/US2015/032486, filed May 26, 2015, which claims the benefit of U.S. Provisional Application No. 62/003,383, filed May 27, 2014, all of which is incorporated by reference herein in its entirety.

TECHNICAL FIELD

The disclosure herein relates to memory systems, and more specifically to substantially buffered memory modules.

BACKGROUND

Memory modules come in a variety of configurations depending on a given application and desired storage capacity. For high-capacity memory modules that employ significant numbers of memory devices, a buffered architecture is often preferred. A buffered approach buffers data transferred between the memory devices and a memory controller, thus limiting loading of a data bus to the limited number of buffer devices, rather than the high number of memory devices. Address and control busses are also typically buffered in these systems.

Buffer circuits that are employed in conventional buffered memory modules typically interface with the memory controller and memory devices via respective primary and secondary data paths. The separate sets of data paths may cause an increase in a read-to-write turnaround time, an important timing parameter for modern memory systems.

Thus, the need exists for improved memory modules and associated methods that significantly improve read-to-write turnaround time.

BRIEF DESCRIPTION OF THE DRAWINGS

Embodiments of the disclosure are illustrated by way of example, and not by way of limitation, in the figures of the accompanying drawings and in which like reference numerals refer to similar elements and in which.

DETAILED DESCRIPTION

Embodiments of memory modules, associated methods and integrated circuits are disclosed herein. One embodiment of the memory module includes a substrate, plural memory devices, and a buffer. Memory modules with buffers generally increase the time it takes to transition from a write operation to a read operation (commonly referred to as a write-to-read turnaround time) because of internal timing delays inherent with the buffers, and due to constraints requiring a bus to be free of write data before transferring read data in the opposite direction. Extensive turnaround times may undesirably affect memory system performance. Embodiments described herein seek to reduce the write-to-read turnaround time by organizing plural memory devices into at least one rank, each memory device having plural banks. The buffer includes a primary interface for communicating with a memory controller and a secondary interface coupled to the plural memory devices. For each bank of each rank of memory devices, the buffer includes data buffer circuitry and address buffer circuitry. The buffer may optionally buffer additional control signals, including clock enable, chip selection, byte enable, data bus inversion, Read/write indication and other control signals. The data buffer circuitry includes first storage to store write data transferred during a bank cycle interval (tRR). The address buffer circuitry includes second storage to store address and control information corresponding to the data stored in the first storage.

In a further embodiment, a method of operation in a memory module having at least one rank of memory devices is disclosed. The method includes receiving first write data from a memory controller along primary data paths. The first write data is buffered on the module, and queued on a per-bank basis for each rank of memory devices. Second write data is then received from the memory controller along the primary data paths. The queued first write data is then transferred along secondary data paths to addressed memory devices in response to receiving the second write data. The buffering function may be entirely contained in one IC or distributed into more than one IC.

In yet another embodiment, an integrated circuit (IC) device is disclosed. The IC device includes respective primary and secondary data interfaces for transferring data between a memory controller and at least one rank of memory devices. Each memory device includes plural memory banks. For each bank of each rank of memory devices, the IC device includes data buffer circuitry and address buffer circuitry. The data buffer circuitry includes first storage to store write data and control information that is typically communicated along with the data, like Byte enable and DBI information transferred during a bank cycle interval (tRR). The address buffer circuitry includes second storage to store address and control information corresponding to the data stored in the first storage.

Figure 1:
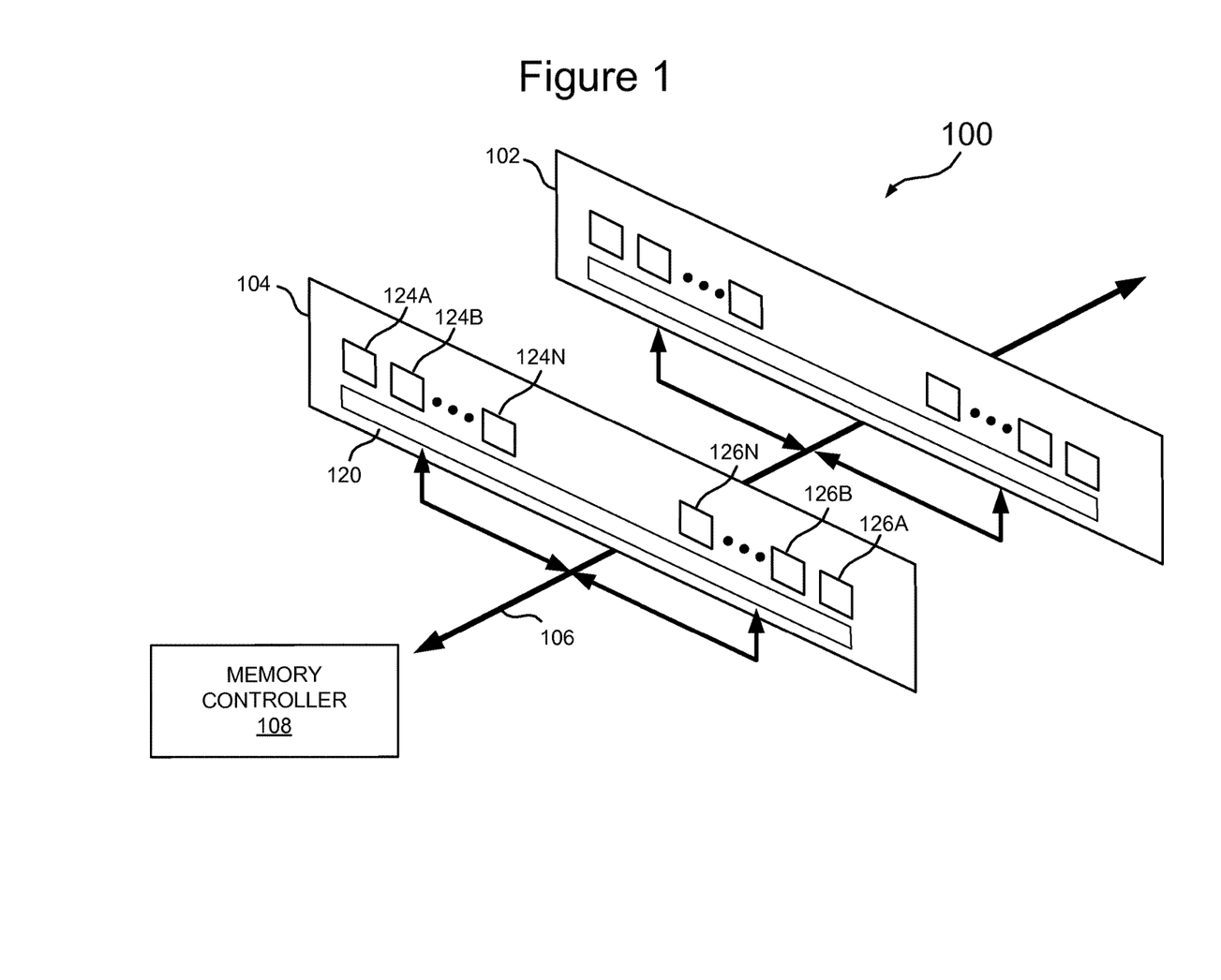
FIG. 1 illustrates one embodiment of a memory system that employs a memory controller and multiple memory modules.

Referring to FIG. 1, one embodiment of a buffered memory architecture, generally designated 100, employs multiple memory modules 102 and 104 coupled to a primary bus 106 that transfers data, command and address signals. Memory control circuitry in the form of a memory controller 108 is also coupled to the primary bus 106 to direct data transfers to and from the modules 102 and 104. The memory control circuitry may include, e.g., a discrete memory controller separate from a requestor integrated circuit (IC). For one embodiment, the memory controller is an IC chip that controls a dynamic random access memory (DRAM).

Further referring to FIG. 1, the embodiment shown illustrates a multi-drop bus, where the primary bus 106 is shared by the modules 102 and 104. Point-to-point topologies are also envisioned, but not illustrated. Each module includes one or more buffer circuits 120 and memory devices 124A-124N and 126A-126N. For one embodiment, the memory devices are DRAM devices. The buffer circuit 120 isolates the memory devices from the primary bus 106 for each module. Thus, instead of the multiple memory devices for each module loading the bus, only the buffer circuits load the bus. This minimizes capacitive loading on the shared primary bus, among other things. As explained more fully below, the buffer circuit 120 may also employ queuing logic to temporarily store write data during write data operations to reduce read-write turnaround timing delays.

Figure 2:
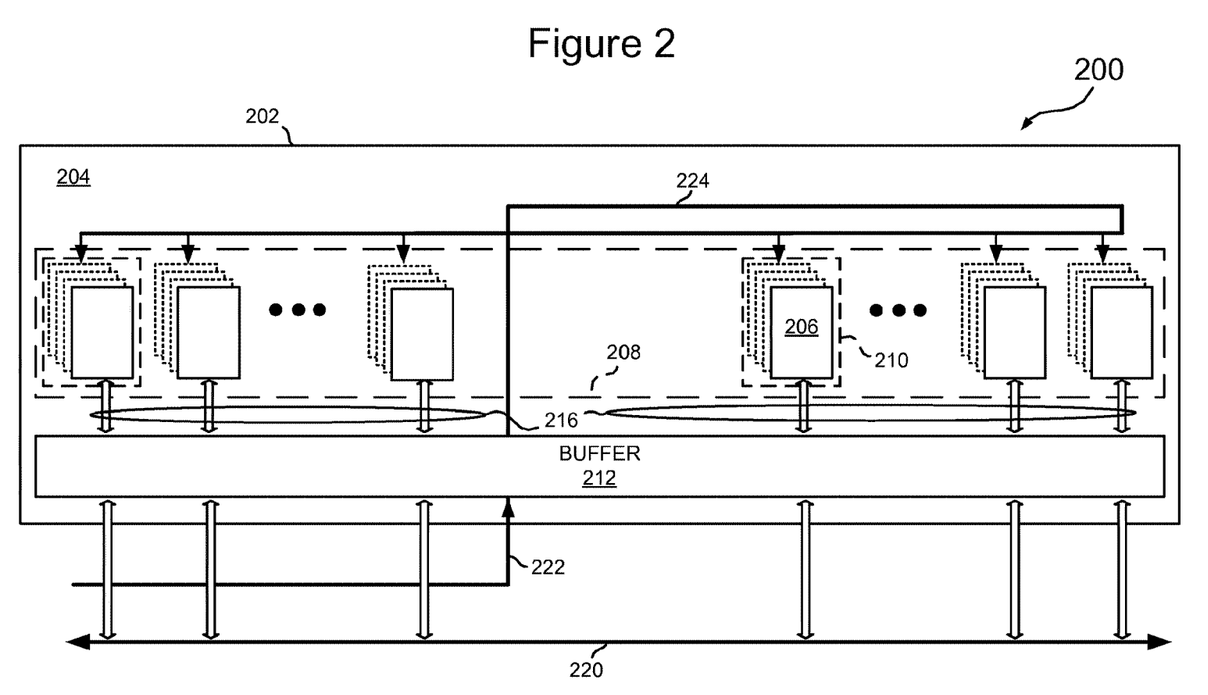
FIG. 2 illustrates one embodiment of a buffered memory module that may be used with the memory system of FIG. 1.

FIG. 2 illustrates additional detail for one embodiment of a memory module, generally designated 200, that corresponds to the memory modules 102 and 104 of FIG. 1. Each module 200 includes a substrate 202 having a front face 204 that mounts a plurality of memory devices 206. In some embodiments, the memory devices may organized as "ranks". Typically, a rank corresponds to a set of otherwise separately addressable memory devices used for a single memory access. Thus, for the example shown in FIG. 2, the memory devices are organized into a single rank 208, and operate in parallel for a given memory operation. Each memory device 206 may be realized as a single memory chip, or packaged to include plural memory die 210 in a stacked configuration (shown in phantom). In some embodiments, an additional set of memory devices may be mounted on the back face of the module, and organized as an additional rank. The memory devices each may include multiple "banks," and all of the banks organized within a given rank of devices. Each bank may be independently accessed via a given bank address.

Further referring to FIG. 2, for one embodiment, the rank 208 of memory devices 206 couples to a buffer 212 via a secondary data bus 216. The buffer 212, in turn, interfaces with a memory controller (not shown) through a primary data bus 220, and a primary command bus 222. A secondary command bus 224 routes command signals from the buffer 212 to the memory devices 206 in a "fly-by" manner. While one buffer 212 is shown in FIG. 1, the buffer may take many different forms, including, for example, a separate buffer chip for each memory device 210.

Figure 3:
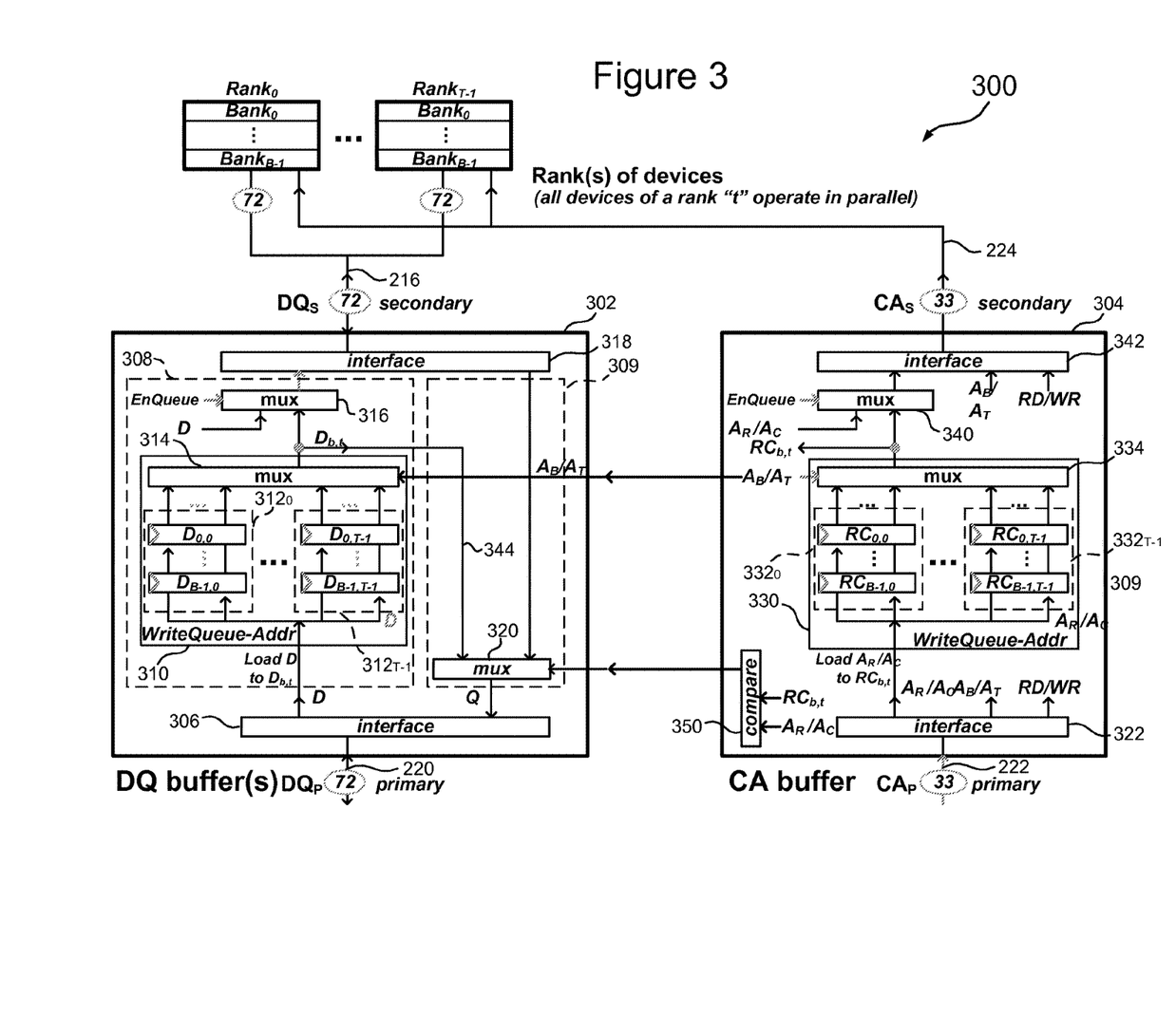
FIG. 3 illustrates an embodiment of a buffer for use with the memory module of FIG. 2, and further detail associated with specific embodiments of respective data and control/address circuits employed in the buffer.

Referring now to FIG. 3, further details for a specific embodiment of a buffer circuit 300 for use in the buffer 212 described in FIG. 2 are shown. Generally, the most common operation performed in the memory system is a read, such that the most common bus operation is a read condition. A write operation causes the bus to transition to a write condition, then eventually back to a read condition. The overhead and time consumed in the bus transition is referred to herein as bus turnaround time, but may be specifically identified herein as a write-to-read turnaround or read-to-write turnaround, depending on the situation. As noted above, to reduce the write-read turnaround delay involved in write-to-read memory operations, the buffer circuit 300 employs queuing logic that temporarily stores a first group of write data while a read operation takes place. While the description that follows is implementation-specific, it is to be understood that a variety of temporary storage or queuing schemes may be employed to achieve the reduced write-read turnaround times described herein.

In one specific embodiment, and with continued reference to FIG. 3, the buffer 300 includes data buffer circuitry 302 and command/address (CA) buffer circuitry 304. The data buffer circuitry includes a primary data interface 306 that couples to the primary data bus 220 (FIG. 2). The primary data interface 306 routes write data along a write data path 308, and read data along a read data path 309.

The write data path 308 includes data queue logic 310 that employs plural data queue circuits $312_0$-$312_{T-1}$ and a data queue multiplexer 314 responsive to bank and rank addresses $A_B/A_T$. Each data queue circuit includes a copy, or "slice" of the resources, such as storage registers, needed to accomplish temporary storage of write data with respect to a write data word transferred to a given bank of a given rank. Thus, the data queue circuits are employed on a per-bank basis for each rank. For the specific example shown in FIG. 3, the leftmost data queue circuit $312_0$ includes separate registers $D_{0,0}$ to $D_{B-1,0}$ corresponding to all of the (B-1) banks in the first rank (0). The right-most data queue circuit $312_{T-1}$ includes separate registers $D_{0,T-1}$ to $D_{B-1,T-1}$ corresponding to all of the (B-1) banks in the last rank (T-1).

Further referring to FIG. 3, a selector 316 responsive to an enabling control signal EnQueue provides a way to disable the data queue logic 310 by routing write data directly from the primary interface 306 to a secondary data interface 318, instead of through the data queue logic 310. The secondary interface 318 couples to the secondary data bus 216, which routes signals between the data buffer circuitry 302 and multiple banks $Bank_0$-$Bank_{B-1}$ of multiple ranks $Rank_0$-$Rank_{T-1}$.

With continued reference to FIG. 3, the read data path 309 couples the secondary data interface 318 to a read data selector 320. The read data selector responds to a control signal generated by a comparison circuit 350, explained more fully below, that fetches queued write data directly as read data in certain circumstances. The output of the read data selector 320 feeds the primary data interface 306 to route the read data to the primary data bus 220.

As noted above, the buffer 300 also includes command/address (CA) buffer circuitry 304. The CA buffer circuitry includes a primary CA interface 322 that receives command and address signals from the primary CA bus 222. The signals may take the form of command/control signals such as those that indicate a read or write operation RD and WR, and address signals indicating row $A_R$, column $A_C$, bank $A_B$ and rank $A_T$ locations for associated data words.

With continued reference to FIG. 3, an output of the primary CA interface 322 feeds row and column addresses AR and AC, corresponding to data received by the primary data interface, to CA queue logic 330. Similar to the data queue logic 310, the CA queue logic 330 includes plural CA queue circuits $332_0$-$332_{T-1}$ and a CA queue multiplexer 334 responsive to bank and rank addresses $A_B/A_T$. Each CA queue circuit includes a copy, or "slice" of the resources, such as storage registers, needed to accomplish temporary storage of write CA information with respect to a write data word transferred to a given bank of a given rank. Thus, the CA queue circuits are employed on a per-bank basis for each rank, similar to how the data queue circuits are configured. For the specific example shown in FIG. 3, the leftmost CA queue circuit $332_0$ includes separate registers $RC_{0,0}$ to $RC_{B-1,0}$ corresponding to all of the (B-1) banks in the first rank (0). The right-most CA queue circuit $332_{T-1}$ includes separate registers $RC_{0,T-1}$ to $RC_{B-1,T-1}$ corresponding to all of the (B-1) banks in the last rank (T-1).

Further referring to FIG. 3, a CA selector 340 responsive to the enabling control signal EnQueue cooperates with the selector 316 to bypass or disable the CA queue logic by routing write CA information (such as row and column address signals AR and AC) directly from the primary CA interface 322 to a secondary CA interface 342, instead of through the CA queue logic 330. The secondary CA interface 342 couples to the secondary CA bus 224, which routes signals between the CA buffer circuitry 304 and the multiple banks $Bank_0$-$Bank_{B-1}$ of the multiple ranks $Rank_0$-$Rank_{T-1}$ of memory devices.

With continuing reference to FIG. 3, in some circumstances, requested read data may include currently queued write data. To minimize delay in retrieving the data, the CA buffer circuitry employs the comparison circuit 350 to receive the output addresses from the CA queue logic, and the incoming addresses for a new read request. The comparison result is then fed to the read data selector 320. If the comparison is a hit, indicating that the write data should be directly fetched as read data, then the write data word output from the data queue logic is routed to the primary data interface and inserted as read data via path 344. The comparison circuit includes synchronization logic (not shown) to transmit the control signal from the comparison circuit to the read data selector within a time interval sufficient to properly carry out the read data insertion.

As explained in further detail below, for one specific embodiment, the write data and associated CA information is queued for an interval corresponding to a bank cycle interval, commonly referred to as a tRR interval. For one embodiment, the interval may correspond to a value programmed into a control register in the buffer. In another embodiment, the interval may be specified in a mode field that forms a portion of a write command received by the buffer.

The memory architecture above lends itself well to reducing the read-to-write turnaround time involved in memory architectures that employ buffer circuitry. By temporarily storing the write data in the buffer circuitry, a read operation can take place more quickly without having to wait for the write data to be written to the memory devices.

Figure 4:
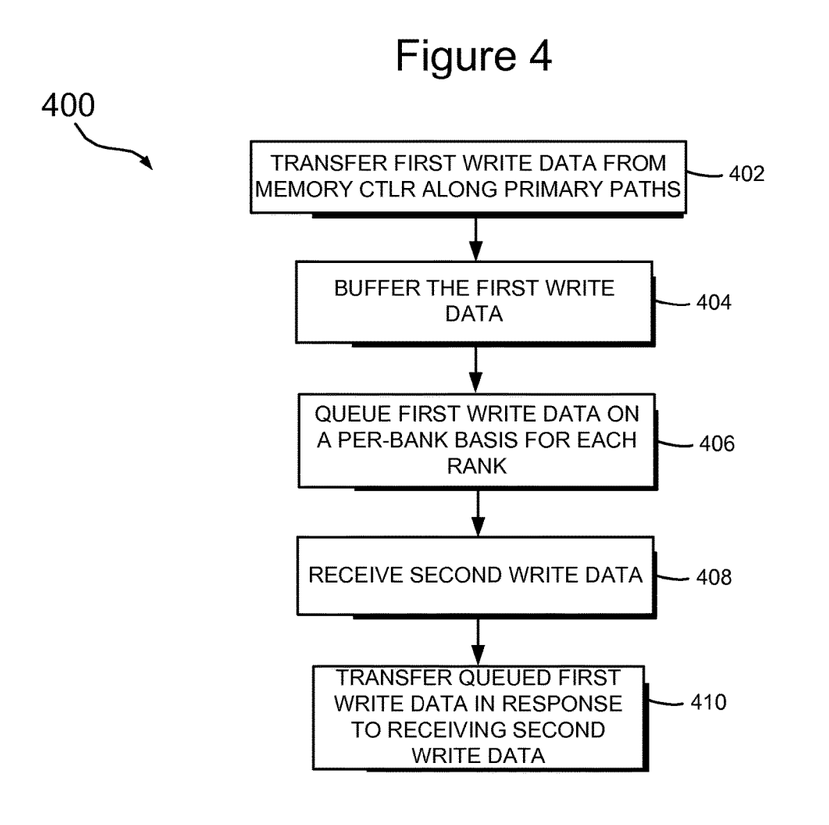
FIG. 4 illustrates a flowchart of steps corresponding to one embodiment of a method of operating the module of FIG. 2.

FIG. 4 shows a flowchart of steps that may be performed in accordance with one embodiment of a method of operation described herein, generally designated 400, during write operations using the circuitry described above and shown in FIGS. 1-3. The method seeks to reduce the read-write turnaround time for data transfers in buffered memory modules.

The method generally involves transferring first write data and associated CA information from the memory controller to a memory module along primary signaling paths, at 402. For one embodiment, the first write data corresponds to a 512 bit column word of data. The first write data and associated CA information are then buffered by the module buffer, at 404. For each rank of memory devices, the first write data is queued in the buffer via the queue logic on a per-bank basis, at 406. The memory module then receives a second column word of write data, at 408. In response to receiving the second write data that is addressed for the same bank and rank as the first write data, the first write data exits the queue for transfer to the memory devices, at 410. By queuing the write data in this manner, a subsequent read operation may take place without having to wait for the write data word to fully transfer to the memory devices.

Figure 5:
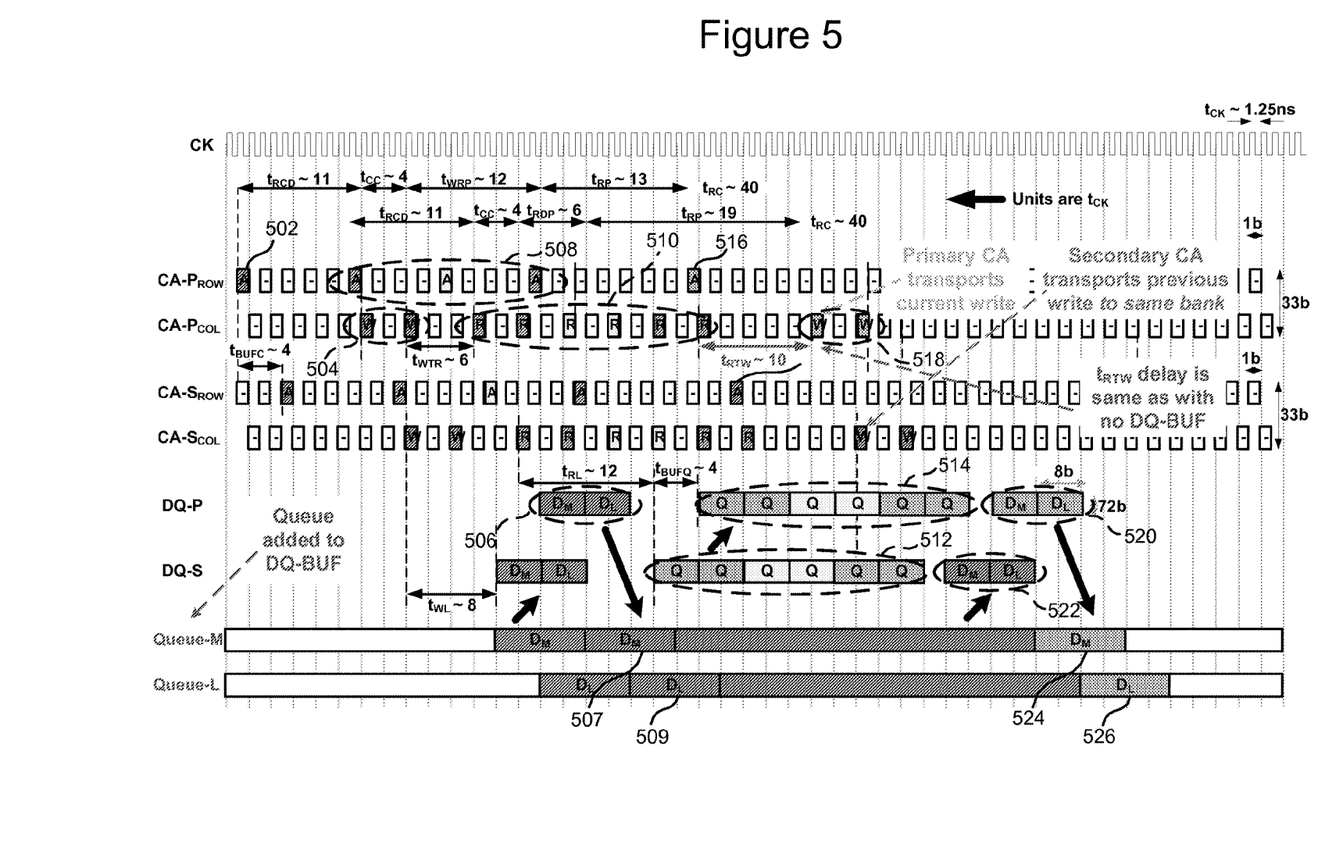
FIG. 5 illustrates a timing chart with a sequence of write-read-write operations corresponding to the flowchart of FIG. 4.

FIG. 5 illustrates a timing chart associated with a set of write-read-write operations consistent with the method steps described above with respect to FIG. 4. The particular operations shown correspond to a module with memory devices operating pursuant to a closed-page policy. In a closed-page policy, the memory devices automatically close or auto-precharge the page currently being accessed, so that accesses to the same bank may proceed more efficiently and at higher speeds. The waveform CK represents a timing reference for the transfer operations, where every four intervals of the clock corresponds to a column cycle time tCC. A tCC is a timing parameter that represents the minimum time necessary to carry out a column access.

Further referring to FIG. 5, at 502, an activate command is received at the primary CA interface to open a given row in a given bank for a data transfer operation. The activate command is followed a tRCD interval later by a first and a subsequent second write command, at 504. First write data (two column data words) corresponding to the write commands is then received at the primary data interface, at 506, then loaded into respective data queue circuits "M" and "L", at 507 and 509. Following the first activate command, a series of additional activate commands are received at the primary CA interface, at 508, corresponding to desired read operations. After a minimum required write-to-read turnaround time tWTR, a series of read commands are then received, at 510. Read data accessed from the memory devices in response to the read commands transfers along the secondary data bus, at 512, and subsequently transfers along the primary data bus, at 514, following a buffer delay tBUFQ. During the read data transfers, the first write data and the corresponding CA information, remains in the data and CA queue circuits.

With continued reference to FIG. 5, following the read operations, a subsequent activate command is received at the primary CA interface, at 516, followed by a pair of write commands, at 518. The write data associated with the subsequent write commands is received at the primary data interface, at 520. Receipt of the second data (directed to the same bank of the same rank) then triggers a transfer of the previously queued first data from the data queue circuits, to the secondary data bus, at 522. The second data is then loaded into the data queue circuits, at 524 and 526, to await loading of additional write data before being transferred along the secondary bus.

Note that the minimum read-to-write turnaround time exhibited by the subsequent write commands with respect to the most recent read commands, shown in FIG. 5 as tRTW, corresponds to a delay typically associated with memory modules having no buffers. Thus, by employing the queue logic in the buffer, read-to-write turnaround delays typically associated with buffered modules may be avoided.

Figure 6:
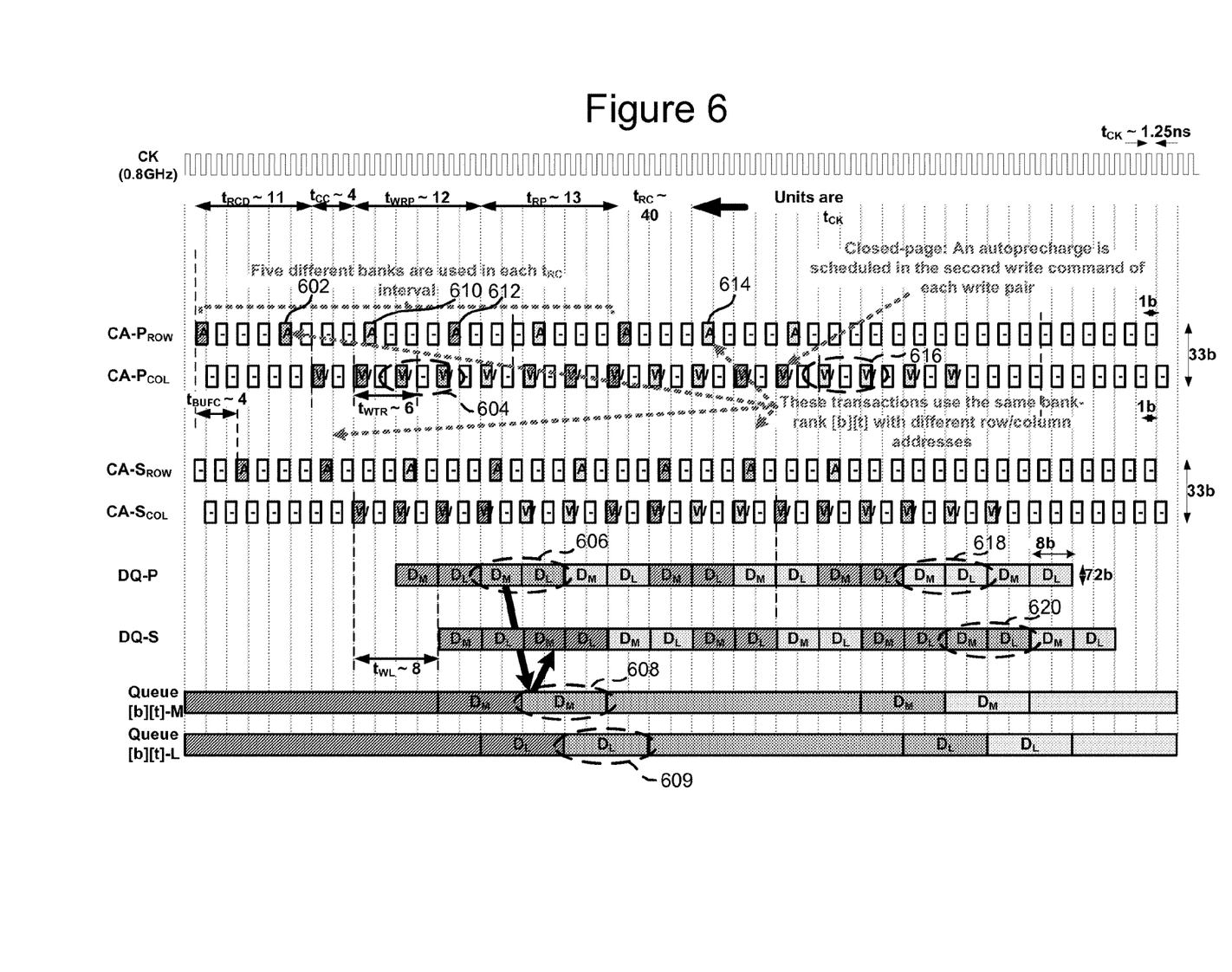
FIG. 6 illustrates a timing chart similar to the timing chart of FIG. 5, for a sequence of closed page write-write operations.

FIG. 6 illustrates a timing chart associated with a set of write-write operations for memory devices operating in accordance with a closed-page policy, similar to FIG. 5. For this example, the write operations are directed to five different banks in a given tRC interval. The timing chart illustrates how data is queued for transactions that involve the same bank-rank, but different row/column addresses. With this in mind, a first activate command to open a given row in a given bank is received at the primary CA interface, at 602. A pair of write commands are then received by the primary CA interface, at 604. The primary data interface receives corresponding write data, at 606, and loads the write data into respective queue circuits that correspond to the addressed bank and rank, at 608 and 609. Subsequent activation and write commands to different banks are then received by the primary CA interface, at 610 and 612. While not shown clue to the scale of the timing chart, the write data from the subsequent write commands is loaded into respective data queue circuits similar to the first write data noted above. At 614, an activate command identifying the same bank-rank as the first write data is received, with corresponding write commands for second data received at 616. The second data is then received at the primary data interface, at 618, thus triggering transfer of the first data from the data queues onto the secondary data bus, at 620. The second data is then loaded into the data queues to await third data addressed for the same bank-rank as the first and second data.

Figure 7:
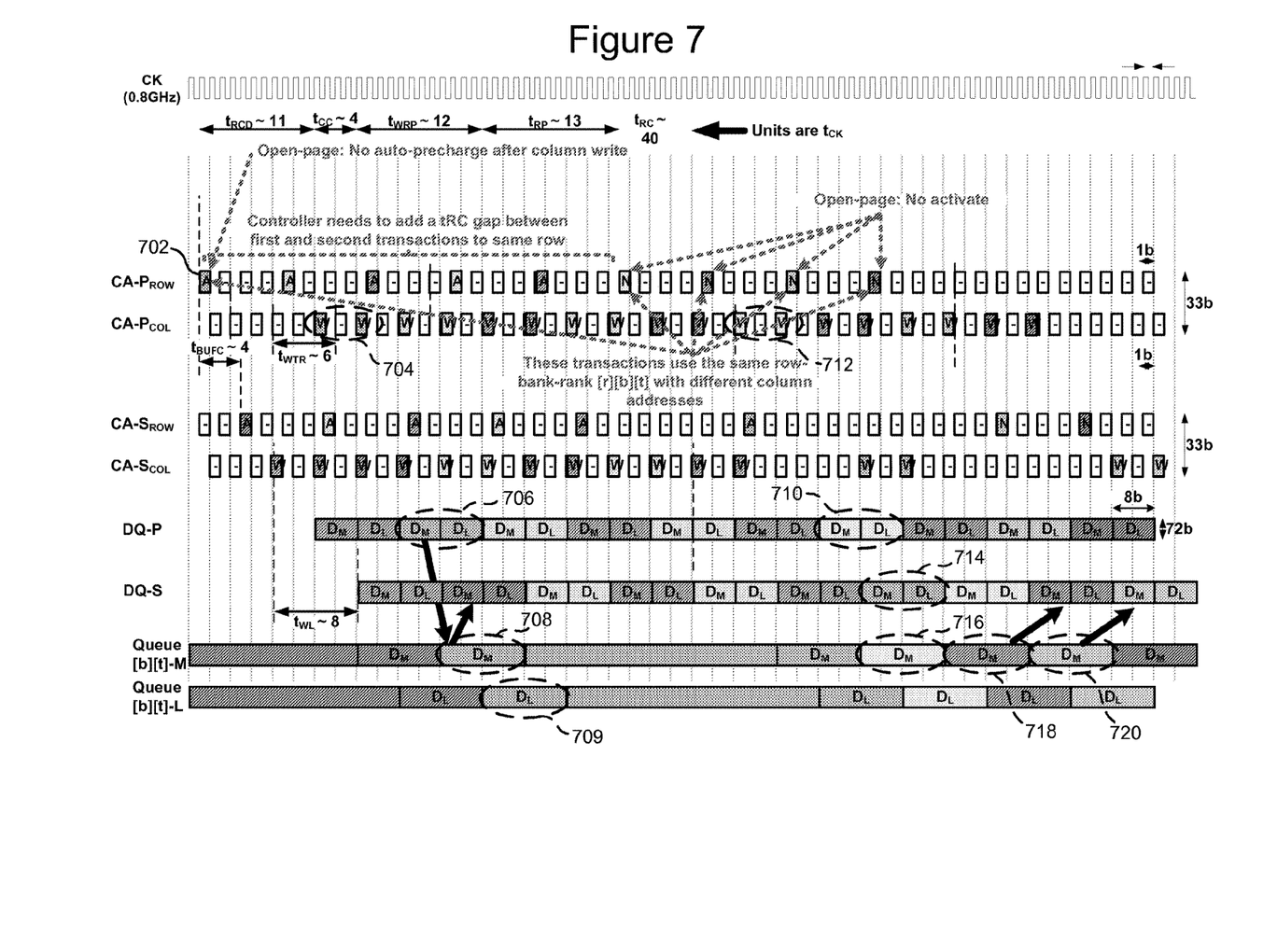
FIG. 7 illustrates a timing chart similar to the timing chart of FIG. 6, for a sequence of open page write-write operations.

FIG. 7 illustrates a timing chart associated with a set of write-write operations for memory devices similar to FIG. 6, but operating in accordance with an open-page policy. In an open-page policy, no auto-precharge operation takes place after a column write command. Further, for one embodiment, the memory controller takes account of the open-page policy by establishing a minimum time gap of a tRC interval between first and second transactions to the same open row.

With continued reference to FIG. 7, a first activate command to open a given row is received at the primary CA interface at 702. Corresponding write commands are then received, at 704, with first write data appearing at the primary data interface at 706. The first write data is then queued by the data queue circuits, at 708 and 709. Second data that is addressed for the same row-bank-rank, but a different column, is received at the primary data interface at 710, following write commands at 712. No activate command is sent since the row (page) is already activated. With the second data received, the first data is transferred to the secondary bus, at 714, and the second data loaded into the queue circuits, at 716. Subsequent data transfers to the same row-bank-rank address are queued and transferred one after another as shown at 718 and 720.

For one embodiment, transactions carried out via open-page policies may involve configuration changes to the memory controller logic. Generally, the controller may have one or more additional constraints that it needs to obey in order to take into account what happens when write data exits the data queue circuits. This may be straightforwardly handled through appropriate controller macro configurations.

In some embodiments, the buffer may be informed that a given activate command is associated with write operations. One way to do this is to enhance the command instruction set by using reserved fields. Another example might involve utilizing one or more bits in a NOP instruction preceding a subsequent activate command to alert the buffer that the very next activate command is associated with a write operation.

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

We claim:
1. A memory module comprising:
a substrate;
plural memory devices organized into at least one rank, each memory device having plural banks;
a buffer having a primary interface for communicating with a memory controller and a secondary interface coupled to the plural memory devices, wherein for each bank of each rank of memory devices, the buffer includes data buffer circuitry including first storage to store write data transferred during a bank cycle interval (tRR), address buffer circuitry including second storage to store address information corresponding to the data stored in the first storage; and wherein the data buffer circuitry transfers the write data along the secondary interface following the tRR interval.

2. The memory module according to claim 1, further comprising:

a write data path coupling the primary interface with the secondary interface; and wherein the first storage and second storage are disposed in the write data path.

3. The memory module according to claim 2, wherein data transfers along the write data path exhibit a delay based on respective storage times associated with the first and second storage.

4. The memory module according to claim 3, wherein:

the address buffer circuitry includes a control register to store a mode value; and the exhibited delay is based on the mode value.

5. The memory module according to claim 3, wherein:

the address buffer circuitry includes a command interface to receive a write command; and the exhibited delay is based on a field in the write command.

6. The memory module according to claim 1, wherein:

for a first mode of operation, the data buffer circuitry and address buffer circuitry are enabled, and wherein a first turnaround interval between a read command and a write command is of a first value; and for a second mode of operation, the data buffer circuitry and address buffer circuitry are not enabled, and wherein a second turnaround interval between the read command and the write command is of a second value, the second value being larger than the first value.

7. The memory module according to claim 1, wherein the plural memory devices are dynamic random access memory (DRAM) devices.

8. A method of operation in a memory module, the memory module having at least one rank of memory devices and a buffer, the method comprising:

receiving, with the buffer, first write data from a memory controller along primary data paths;

buffering, with the buffer, the first write data on the module;

queuing, with the buffer, the first write data on a per-bank basis for each rank of memory devices;

receiving, with the buffer, second write data from the memory controller along the primary data paths;

transferring, from the buffer, the queued first write data along secondary data paths to addressed memory devices in response to receiving the second write data; and wherein the queuing comprises delaying writing of the first write data to the memory devices by a delay interval.

9. The method according to claim 8, further comprising:

retrieving mode information from a register; and wherein the delay interval is based on the retrieved mode information.

10. The method according to claim 8, further comprising:

receiving a write command, the write command including a mode field; and wherein the delay interval is based on the mode field.

11. The method according to claim 8, wherein queuing comprises selectively queuing based on a programmed mode of operation.

12. The method of claim 11, wherein:

for a first mode of operation, the queuing is enabled, and wherein a first turnaround interval between a read command and a write command is of a first value; and for a second mode of operation, the queuing is not enabled, and wherein a second turnaround interval between the read command and the write command is of a second value, the second value being larger than the first value.

13. An integrated circuit (IC) device comprising:

respective primary and secondary data interfaces for transferring data between a memory controller and at least one rank of memory devices, each memory device having plural memory banks;

wherein for each bank of each rank of memory devices, the IC device includes data buffer circuitry including first storage to store write data transferred during a bank cycle interval (tRR), address buffer circuitry including second storage to store address information corresponding to the data stored in the first storage; and wherein the data buffer circuitry transfers the write data along the secondary data interface following the tRR interval.

14. The integrated circuit (IC) device according to claim 13, further comprising:

a write data path coupling the primary interface with the secondary interface; and wherein the first storage and second storage are disposed in the write data path.

15. The integrated circuit (IC) device according to claim 14, wherein data transfers along the write data path exhibit a delay based on respective storage times associated with the first and second storage.

16. The integrated circuit (IC) device according to claim 15, wherein:

the address buffer circuitry includes a control register to store a mode value; and the exhibited delay is based on the mode value.

17. The integrated circuit (IC) device according to claim 15, wherein:

the address buffer circuitry includes a command interface to receive a write command; and the exhibited delay is based on a field in the write command.

18. The integrated circuit (IC) device according to claim 13, wherein:

for a first mode of operation, the data buffer circuitry and address buffer circuitry are enabled, and wherein a first turnaround interval between a read command and a write command is of a first value; and for a second mode of operation, the data buffer circuitry and address buffer circuitry are not enabled, and wherein a second turnaround interval between the read command and the write command is of a second value, the second value being larger than the first value.

19. The integrated circuit (IC) device according to claim 14, embodied as an IC buffer chip.

* * * * *